(12) United States Patent
Cao et al.

(10) Patent No.: US 10,355,118 B2
(45) Date of Patent: Jul. 16, 2019

(54) SINGLE-ELECTRON TRANSISTOR WITH SELF-ALIGNED COULOMB BLOCKADE

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Zhengwen Li, Chicago, IL (US); Fei Liu, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/988,375

(22) Filed: May 24, 2018

(65) Prior Publication Data

US 2018/0277670 A1 Sep. 27, 2018

Related U.S. Application Data

(62) Division of application No. 15/170,448, filed on Jun. 1, 2016, now Pat. No. 10,032,897.

(51) Int. Cl.

| | |
|---|---|
| *H01L 29/76* | (2006.01) |
| *H01L 29/66* | (2006.01) |
| *H01L 21/306* | (2006.01) |
| *H01L 21/02* | (2006.01) |
| *H01L 29/10* | (2006.01) |
| *H01L 29/165* | (2006.01) |
| *H01L 29/08* | (2006.01) |
| *H01L 29/423* | (2006.01) |
| *H01L 29/06* | (2006.01) |

(Continued)

(52) U.S. Cl.
CPC ......... *H01L 29/7613* (2013.01); *B82Y 10/00* (2013.01); *H01L 21/02532* (2013.01); *H01L 21/30604* (2013.01); *H01L 29/0649* (2013.01); *H01L 29/0847* (2013.01); *H01L 29/1033* (2013.01); *H01L 29/1037* (2013.01); *H01L 29/127* (2013.01); *H01L 29/165* (2013.01); *H01L 29/4232* (2013.01); *H01L 29/42372* (2013.01); *H01L 29/66439* (2013.01)

(58) Field of Classification Search
CPC ..................... H01L 29/7613; H01L 29/7888
See application file for complete search history.

(56) References Cited

U.S. PATENT DOCUMENTS

| | | | |
|---|---|---|---|
| 6,653,653 | B2 | 11/2003 | Brousseau, III |
| 7,067,341 | B2 | 6/2006 | Mascolo et al. |

(Continued)

FOREIGN PATENT DOCUMENTS

| | | |
|---|---|---|
| CN | 101276836 | 6/2010 |
| CN | 101359684 | 6/2010 |

(Continued)

OTHER PUBLICATIONS

List of IBM Patents or Patent Applications Treated as Related dated May 24, 2018, 2 pages.

*Primary Examiner* — Robert K Carpenter
(74) *Attorney, Agent, or Firm* — Tutunjian & Bitetto, P.C.; Jennifer Davis

(57) ABSTRACT

Semiconductor devices include a thin channel region formed on a buried insulator. A source and drain region is formed on the buried insulator, separated from the channel region by notches. A gate structure is formed on the thin channel region.

17 Claims, 5 Drawing Sheets

(51) Int. Cl.
*B82Y 10/00* (2011.01)
*H01L 29/12* (2006.01)

(56) References Cited

U.S. PATENT DOCUMENTS 7,550,759 B2 6/2009 Hakonen et al.
7,605,065 B2 10/2009 Jang et al.

FOREIGN PATENT DOCUMENTS

| CN | 103531466 | 1/2014 |
| CN | 103681829 | 3/2014 |
| KR | 100966264 | 6/2010 |
| KR | 101069361 | 9/2011 |
| KR | 1020110136641 | 12/2011 |
| KR | 101110736 | 1/2012 |
| KR | 101246306 | 3/2013 |

SINGLE-ELECTRON TRANSISTOR WITH SELF-ALIGNED COULOMB BLOCKADE

BACKGROUND

Technical Field

The present invention relates to semiconductor devices and, more particularly, to single-electron transistors.

Description of the Related Art

As conventional fabrication methods improve, and logic devices such as transistors become smaller, devices approach a limit of what can be achieved using standard complementary metal-oxide semiconductor (CMOS) processes. Single-electron transistors (SETs), which operate by quantum tunneling effects, can provide logic devices at even smaller scales than CMOS. However, conventional SETs need very low temperatures to operate correctly. In addition, it is difficult to manufacture the Coulomb blockade in an SET reliably.

SUMMARY

A semiconductor device includes a thin channel region formed on a buried insulator. A source and drain region is formed on the buried insulator, separated from the channel region by notches. A gate structure is formed on the thin channel region.

A semiconductor device includes a thin channel region formed on a buried insulator. A source and drain region are formed on the buried insulator, physically separated from the channel region by notches that are formed along a consistent crystal face of the respective channel region and source and drain regions. A dielectric layer is deposited in the notches to create a Coulomb blockade between the channel region and the source and drain regions. A gate structure is formed on the thin channel region.

A semiconductor device includes a buried insulator layer. An etch stop layer is formed directly on the buried insulator layer and includes an undoped first semiconductor material. A thin channel region is formed directly on the etch stop layer and includes a doped second semiconductor material that is different from the first semiconductor material. A source and drain region is formed on the buried insulator, physically separated from the channel region by notches that are formed along a consistent crystal face of the respective channel region and source and drain regions. A dielectric layer is formed in the notches to create a Coulomb blockade between the channel region and the source and drain regions. A gate structure is formed on the thin channel region.

A semiconductor device includes a buried insulator layer. An etch stop layer is formed directly on the buried insulator layer and includes an undoped first semiconductor material. A thin channel region is formed directly on the etch stop layer and includes a doped second semiconductor material that is different from the first semiconductor material. A source and drain region are formed on the buried insulator, physically separated from the channel region by notches that are formed along a consistent crystal face of the respective channel region and source and drain regions. A dielectric layer is formed in the notches to create a Coulomb blockade between the channel region and the source and drain regions. A gate structure is formed on the thin channel region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide single-electron transistors (SETs) that operate at high temperature and uses complementary metal oxide semiconductor (CMOS) fabrication processes to control the dimensions of the Coulomb blockade. A channel is formed with a length and width being controlled by sidewall image transfer and the Coulomb blockade thickness being controlled by extremely thin semiconductor-on-insulator deposition. The Coulomb blockade is formed as notches between the channel and the source and drain regions.

Figure 1:
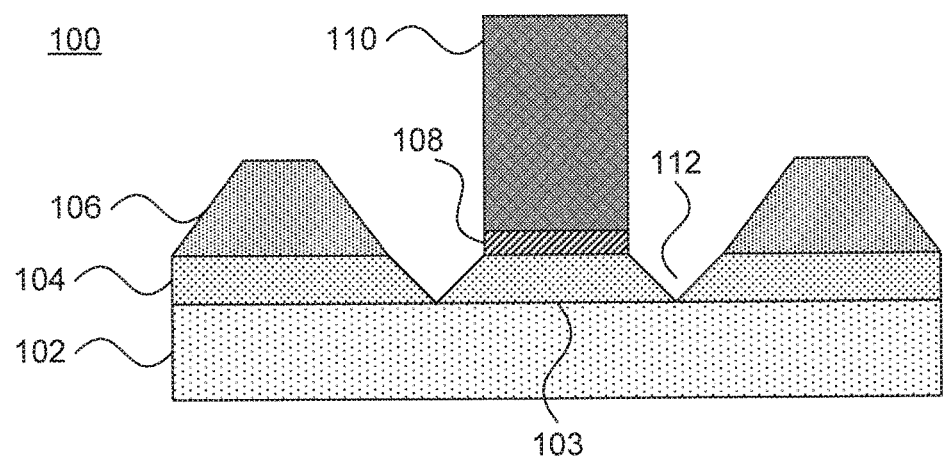
FIG. 1 is a diagram of a single-electron transistor (SET) in accordance with the present principles.

Referring now to FIG. 1, a diagram of an SET 100 is shown. Starting from an extremely thin semiconductor-on-insulator substrate, a channel 103 and source/drain regions 104 are formed on a buried dielectric layer 102. Epitaxially grown source/drain extensions 106 are formed on the top surfaces of the source/drain regions 104. A gate conductor 110 and gate dielectric 108 are formed on the channel 103. Notches 112 are cut to separate the channel 103 from the source/drain regions 104. The notches 112 form the Coulomb blockade and are sized to provide a potential barrier according to design specification.

The SET 100 operates by quantum tunneling. A drain voltage is applied to the drain terminal (while the source terminal is grounded). In the blocking state, electrons at the source terminal cannot tunnel onto the channel 103, as there are no appropriate energy levels for it there. Applying the gate voltage to the gate 110, however, causes the energy levels of the channel 103 to change, putting at least one energy level within reach of the electron. The electron tunnels from the source terminal to the channel 103 and subsequently tunnels to the drain terminal to form a current, such that the SET 100 is in a conducting state when the gate voltage is applied.

The operation of the SET 100 is characterized by the capacitances of the different components. In particular, a total capacitance ($C_{total}$) is the sum of the gate capacitance (between the channel 103 and the gate 110), the drain capacitance (between the channel 103 and the drain terminal), and the source capacitance (between the channel 103 and the source terminal). It should be noted that the channel 103 is selected to have low self-capacitance. To operate an SET 100 at high temperature, the size (namely, $C_{total}$) of the channel 103 should be very small, such that the charging energy of an electron ($q^2/2C_{total}$) is substantially larger than the thermal energy (e.g., roughly 26 mEV at room temperature), where q is the charge of an electron. To achieve SET functionality at room temperature, the channel island 103 should be as small as possible and, in one embodiment, has a dimension in each direction that is smaller than 10 nm.

Figure 2:
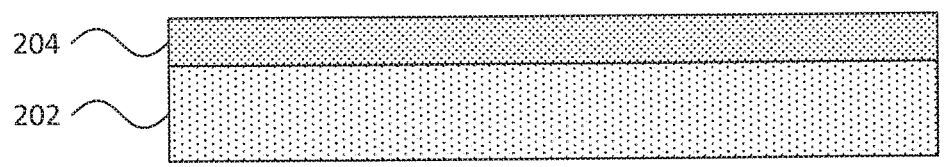
FIG. 2 is a diagram of a step in the formation of an SET in accordance with the present principles.

Referring now to FIG. 2, a step in fabricating an SET is shown. An extremely thin semiconductor-on-insulator (ET-SOI) substrate is formed from a thin, doped semiconductor layer 204 on a buried insulator layer 202. The semiconductor layer 204 may be formed from a silicon-containing material. In one particular embodiment, the semiconductor layer 204 has a thickness between about 1 nm and about 10 nm with a specifically contemplated embodiment having a thickness of about 5 nm. In one embodiment, the buried insulator layer 202 has a thickness ranging from 10 nm to 3000 nm. In one specific embodiment, the buried insulator layer 202 has a thickness of about 100 nm.

Illustrative examples of silicon-containing materials suitable for the semiconductor layer 204 may include, but are not limited to, silicon, silicon germanium, silicon germanium carbide, silicon carbide, polysilicon, epitaxial silicon, amorphous silicon, and multilayers thereof. Although silicon is predominately used in wafer fabrication, alternative semiconductor materials can be employed, such as, but not limited to, germanium, gallium nitride, cadmium telluride, and zinc selenide. It is specifically contemplated that the buried insulator layer 202 may be formed from silicon dioxide, but it should be understood that any appropriate dielectric material may be used instead.

Further alternatives for the semiconductor layer 204 include III-V compound semiconductors. The term "III-V compound semiconductor" denotes a semiconductor material that includes at least one element from Group III of the Periodic Table of Elements (International Union of Pure and Applied Chemistry Group 13) and at least one element from Group V of the Periodic Table of Elements (International Union of Pure and Applied Chemistry Group 15). Typically, the III-V compound semiconductors are binary, ternary or quaternary alloys including III/V elements. Examples of III-V compound semiconductors that can be used in the present embodiments include, but are not limited to alloys of gallium arsenic, aluminum arsenic, indium gallium arsenic, indium aluminum arsenic, indium aluminum arsenic antimony, indium aluminum arsenic phosphurs, indium gallium arsenic phosphurs and combinations thereof.

The semiconductor layer 204 is doped to make the eventual channel region of the device conductive. In one particular embodiment, a p-type dopant may be used. As used herein, "p-type" refers to the addition of impurities to an intrinsic semiconductor that creates deficiencies of valence electrons. In a silicon-containing substrate, examples of p-type dopants, i.e., impurities, include but are not limited to: boron, gallium, and indium. In another embodiment, an n-type dopant may be used. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. The dopant may be formed in situ with the semiconductor layer 204 or may, alternatively, be doped by gas phase doping, solid phase doping, liquid phase doping, ion implantation, infusion doping, cluster doping, and/or plasma doping. The dopant may have an exemplary concentration between zero and about $5\times10^{21}$ atoms/cm$^3$.

The thin semiconductor layer 204 may be formed at an original thickness and then thinned to a specified thickness by planarization, grinding, wet etch, dry etch, oxidation followed by an oxide etch, or by any combination of the above. One particular thinning process includes oxidizing the semiconductor layer 204 by a thermal dry or wet oxidation process followed by a wet etch using, e.g., a hydrofluoric acid mixture. This process can be repeated to achieve the specified thickness.

Figure 3:
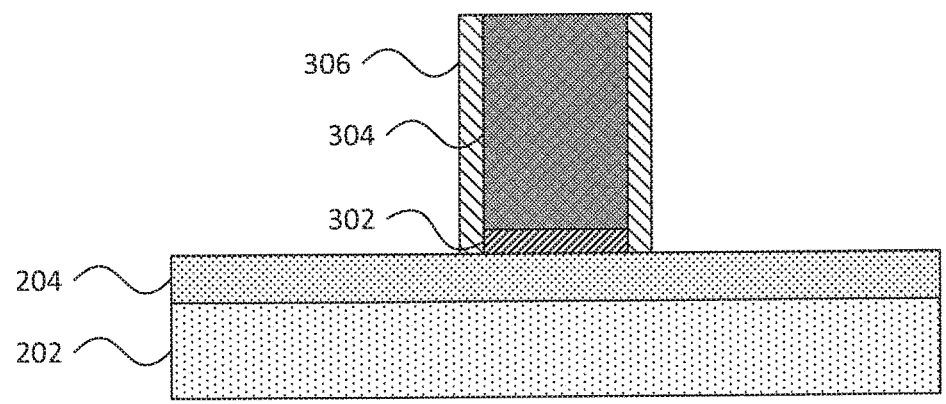
FIG. 3 is a diagram of a step in the formation of an SET in accordance with the present principles.

Referring now to FIG. 3, a step in fabricating an SET is shown. A gate dielectric 302 is formed, and a gate 304 is formed over the gate dielectric 302. The gate 304 and gate dielectric 302 define a channel region of the semiconductor layer 204. Although any appropriate fabrication process may be used to form the gate 304 and gate dielectric 302, it is specifically contemplated that sidewall image transfer may be used. Spacers 306 are formed on the sidewalls of the gate 304 and may be formed from silicon nitride or any other appropriate dielectric material.

The spacers 306 may be formed by conformally depositing the spacer material across all surfaces and then anisotropically etching the spacer material from horizontal surfaces. It is specifically contemplated that chemical vapor deposition (CVD) may be used to deposit the material, although physical vapor deposition (PVD), atomic layer deposition (ALD), and gas cluster ion beam (GCIB) deposition are also contemplated. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

The anisotropic etch that removes the spacer material from horizontal surfaces may, for example, by a reactive ion etch (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point include ion beam etching, plasma etching or laser ablation.

In a sidewall image transfer fabrication process, a mandrel is formed on the semiconductor layer 204, patterned to a size within the scope of a photolithographic fabrication process.

Sidewalls are then formed on the mandrel, for example by a conformal deposition process, and the thickness of the sidewalls can be closely controlled to produce very thin structures. The mandrel is then removed, leaving the sidewalls in place, and the sidewalls are used to pattern very thin fins onto the semiconductor layer 204. This process can be performed twice, with the second iteration being based on a mandrel that is perpendicular to the first mandrel, to produce a final gate structure 110 that has a length and width defined by the sidewall thickness of the respective sidewall image transfer processes. In one specific embodiment, it is contemplated that the gate 110 may have a length and width of about 5 nm, but it should be understood that these dimensions may be adjusted in accordance with design needs. Alternatively, the ETSOI layer can be patterned into stripes, for example, by a first sidewall image transfer process. Each stripe may have a width of about 2 nm to 10 nm, preferably 5 nm. The gate dielectric and gate conductor may then be deposited over the stripes and between stripes. A second sidewall image transfer process is then used to pattern the gate. The gate width is defined herein as the distance between two edges of the gate structure. The gate may be orthogonal to ETSOI stripes.

The gate 110 may be a final gate structure or may, alternatively, be a dummy gate structure that is subsequently replaced. If a replacement gate process is used, then the dummy gate material may include, for example, amorphous silicon or poly-silicon. If the gate 110 is a final gate structure, the gate material may be formed from a metal, but it should be understood that alternative gate materials may include polysilicon germanium, polysilicon/metal silicide, germanium, silicon germanium, silicon germanium carbide, metal silicides, metallic nitrides, metals such as tungsten, iridium, rhenium, ruthenium, titanium, tantalum, hafnium, molybdenum, niobium, nickel, or aluminum, or any other appropriate conductive material.

It is specifically contemplated that the gate dielectric 108 may be silicon oxide, silicon nitride, silicon oxynitride, and/or a high-k dielectric, but any appropriate insulating material may be used instead. A high-k dielectric is a material having a dielectric constant k that is greater than that of silicon dioxide. Exemplary high-k dielectric materials include hafnium oxides, zirconium oxides, lanthanum oxides, aluminum oxides, titanium oxides, strontium titanium oxides, lanthanum aluminum oxides, yttrium oxides, hafnium oxynitrides, zirconium oxynitrides, lanthanum oxynitrides, aluminum oxynitrides, titanium oxynitrides, strontium titanium oxynitrides, lanthanum aluminum oxynitrides, yttrium oxynitrides, and multilayers thereof.

Figure 4:
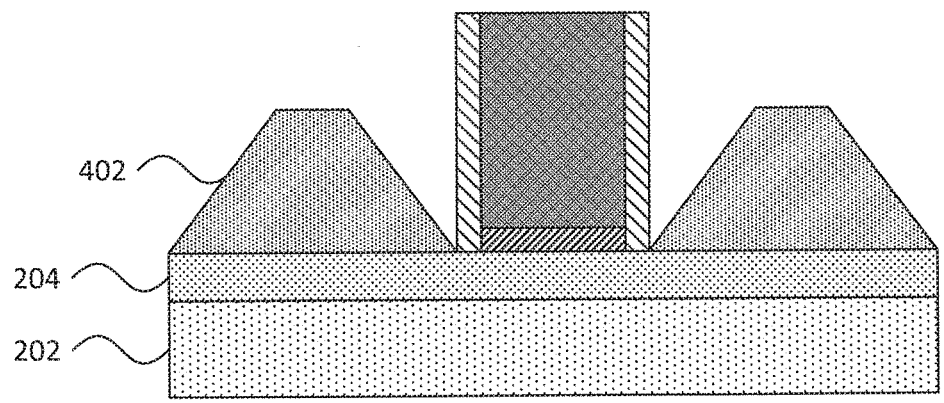
FIG. 4 is a diagram of a step in the formation of an SET in accordance with the present principles.

Referring now to FIG. 4, a step in fabricating an SET is shown. Additional semiconductor material 402 is epitaxially grown from exposed portions of the semiconductor layer 204. The additional semiconductor material 402 is grown in such a manner as to produce a faceted structure, with faces having uniform crystal orientation. The additional semiconductor material 402 is doped, and it is specifically contemplated that the doping may be performed in situ during growth, although other forms of doping are also contemplated. It is specifically contemplated that silicon may be used for the additional semiconductor material 402, though it should be understood that alternative materials such as silicon germanium, carbon doped silicon, carbon doped silicon germanium, may be used as long as the alternative materials can be etched with the semiconductor layer 204.

The epitaxy process can be an ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $5\times10^{21}$ $cm^{-3}$, or preferably between $2\times10^{20}$ $cm^{-3}$ to $1\times10^{21}$ $cm^{-3}$. When silicon carbide is epitaxially grown, the silicon carbide layer may include carbon in the range of 0.2 to 3.0%. When silicon germanium is epitaxially grown, the silicon germanium may have germanium content in the range of 5% to 100%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 5:
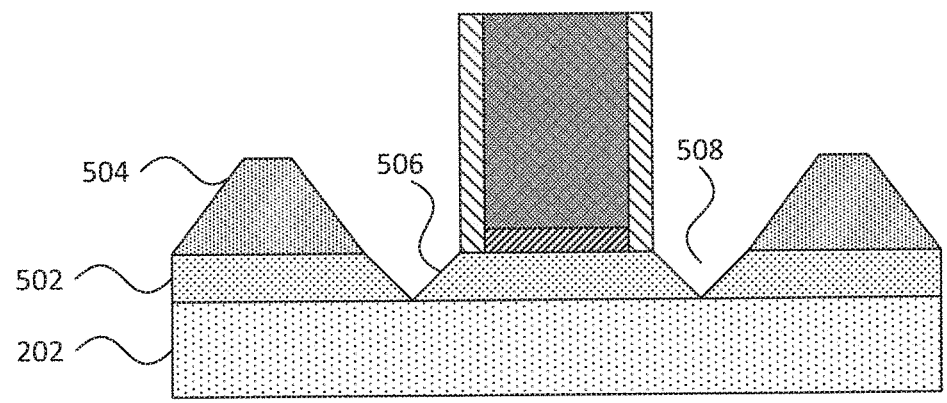
FIG. 5 is a diagram of a step in the formation of an SET in accordance with the present principles.

Referring now to FIG. 5, a step in fabricating an SET is shown. An etch is performed to create notches 508 that form a Coulomb barrier between source/drain regions 502 of the semiconductor layer 204 and the channel region 506 of the semiconductor layer 204. The additional material 402 is also etched down to form source/drain extensions 504. It should be understood that the notches 508 reach down to the buried insulator layer 202 to break a direct electrical connection between the channel region 506 and the source/drain regions 502.

In one specific example, a wet etch containing, e.g., ammonia or tetramethylammonium hydroxide (TMAH), may be used, after epitaxy, to etch the semiconductor material using a self-limiting plane etch along a particular crystal orientation (for example {111}). Alternatively, the etch shown may be performed during the epitaxial growth of FIG. 4, for example using cyclic deposition/etch processing. The etch processing may include gas phase etch using hydrochloride. After etching, the remaining crystalline planes are {111}, as those planes are etched much slower than other crystalline planes such as {100} and {110}.

Figure 6:
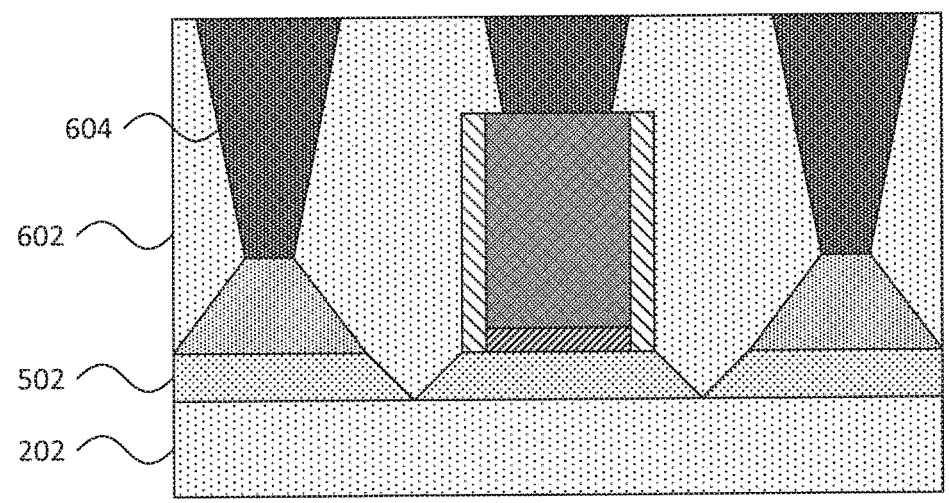
FIG. 6 is a diagram of a step in the formation of an SET in accordance with the present principles.

Referring now to FIG. 6, a step in fabricating an SET is shown. A passivating interlayer dielectric 602 is deposited over the exposed structures of the device. It is specifically contemplated that the interlayer dielectric 602 may be formed from, e.g., silicon dioxide, fluorine doped silicon oxide, carbon doped silicon oxide, etc. Contacts 604 are formed by forming holes in the interlayer dielectric 602 down to the underlying source/drain extensions 504 and the gate 304 and filling holes with conducting material(s). The conducting materials may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further include dopants that are incorporated during or after deposition.

To form the interlayer dielectric 602, a layer of dielectric material is first deposited using, e.g., CVD or any other appropriate deposition process. The top surface of the dielectric material is then polished down to a specified height of the interlayer dielectric 602 using, e.g., chemical mechanical planarization (CMP). CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 7:
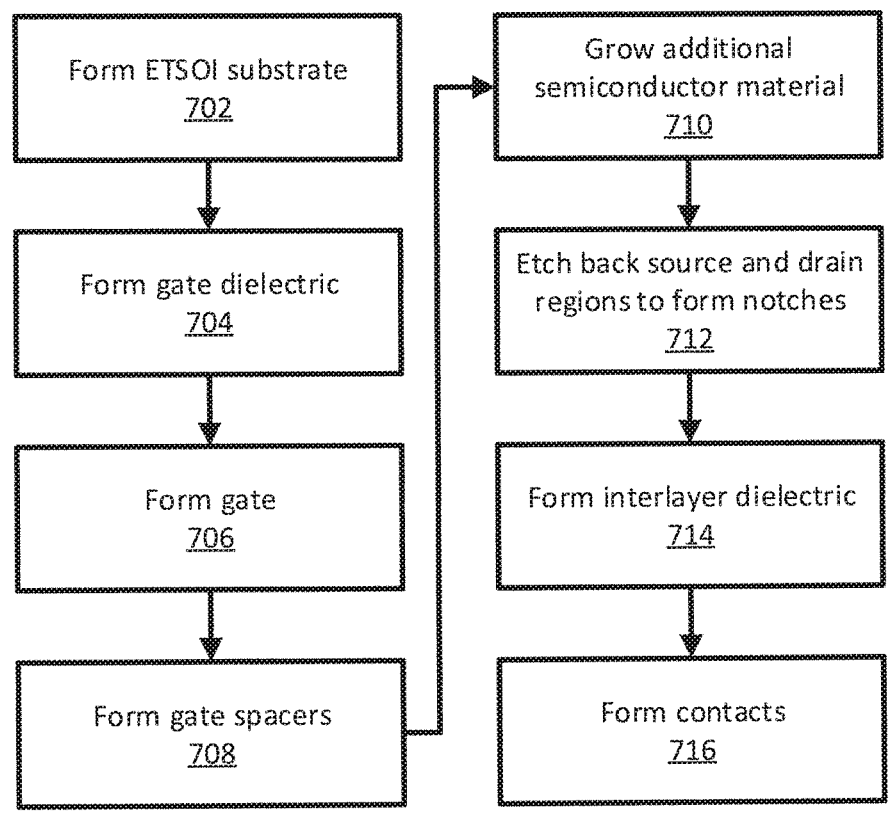
FIG. 7 is a block/flow diagram of a method of forming an SET in accordance with the present principles.

Referring now to FIG. 7, a method of forming an SET is shown. Block 702 forms an ETSOI substrate by thinning a semiconductor layer through one or more thinning steps to achieve a thin semiconductor layer 204 that has, for example, a thickness of about 5 nm. The ETSOI is doped, either in situ or in a separate doping process.

Block 704 forms a gate dielectric 302 and block 706 forms a gate 304 using, for example, a sidewall image transfer process that defines the length and width of the gate 304 through the thickness of deposited sidewalls that are subsequently used as masks for anisotropic etches. Block 708 forms gate spacers 306 by conformally depositing a spacer material, such as silicon nitride, and then anisotropically etching away spacer material from the horizontal surfaces.

Block 710 epitaxially grows additional semiconductor material 402 on the semiconductor layer 204 around the gate spacers 306. It is specifically contemplated that the additional semiconductor material 402 may also be doped, either in situ or by a subsequent doping process. Block 712 etches back the additional material 402 and the semiconductor layer 204, using an etch that follows the crystal structure of the layers to create notches 508 between a channel region 506 and a source/drain region 502. These notches 508 form the Coulomb barrier and are spaced such that a desired potential barrier is created.

Block 714 then forms an interlayer dielectric 602 by depositing a dielectric material and then polishing down the top surface using, e.g., CMP. Contacts 604 are formed to the source/drain extensions 504 and to the gate 304 by forming vias in the interlayer dielectric 602 and then depositing a contact conductor material. Exemplary materials for the contacts 604 include, for example, tungsten, copper, aluminum, silver, gold, and alloys thereof. The contacts 604 may be formed by any appropriate process including, e.g., CVD followed by a CMP that stops on the interlayer dielectric 602.

Figure 8:
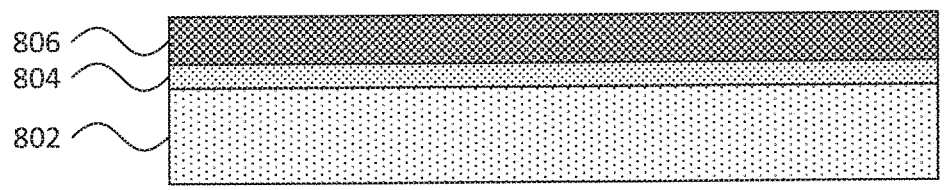
FIG. 8 is a diagram of a step in the formation of an alternative SET in accordance with the present principles.

Referring now to FIG. 8, a step in fabricating an alternative embodiment of an SET is shown. A semiconductor bilayer is employed instead of semiconductor layer 204, with the bilayer being formed from a thin, undoped layer of a first semiconductor material 804 and a second, doped layer of a second semiconductor material 806. It is specifically contemplated that the undoped 804 layer may be formed from silicon and may have an exemplary thickness of about 2 nm, while the doped 806 layer may be formed from silicon germanium and may have an exemplary thickness of about 4 nm. It should be understood, however, that other thicknesses and other materials may be used instead as called for by the particular application.

The thin, undoped layer 804 may be formed as described above, with a layer of the first semiconductor material being deposited and then oxidized and etched until a specified thickness is reached. The doped layer 806 may then be epitaxially grown on the undoped layer 804 as described above and may be doped in situ or may be doped after growth by, e.g., plasma doping.

The first semiconductor material and the second semiconductor material have etch selectivity with respect to one another, such that the undoped layer 804 serves as an etch stop layer to improve the controllability of the process. The doped layer 806 may have any appropriate doping, as discussed above.

Figure 9:
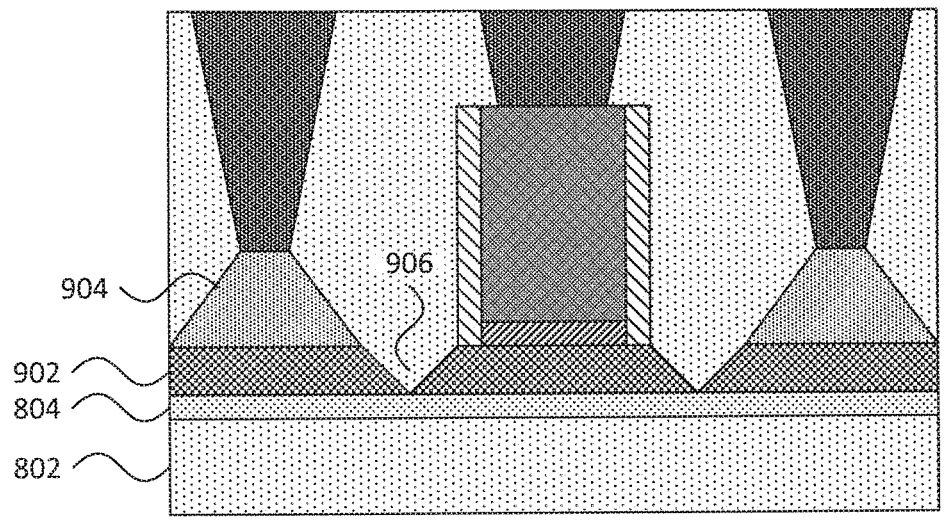
FIG. 9 is a diagram of a step in the formation of an alternative SET in accordance with the present principles.

Referring now to FIG. 9, a step in fabricating an alternative embodiment of an SET is shown. FIG. 9 shows a finished device using the semiconductor bilayer described in FIG. 8. The intervening processing steps are the same, with the epitaxially grown source/drain extensions 904 being formed from either doped second semiconductor material or from doped first semiconductor material. The wet etch that forms the notches 906 selectively removes the second material and stops on the first semiconductor material, leaving the etched doped layer 902.

In some embodiments, a two-step etch may be used. For example, if the source/drain extensions 904 are formed from the first semiconductor material (e.g., phosphorous-doped silicon), then they may be etched selective to the second semiconductor material (e.g., silicon germanium) using a wet etch that includes, e.g., ammonia. The second semiconductor material may then be etched relative to the first semiconductor material of the source/drain extensions 904 and the underlying layer 804 using a wet etch that includes, e.g., hydroperoxide.

Figure 10:
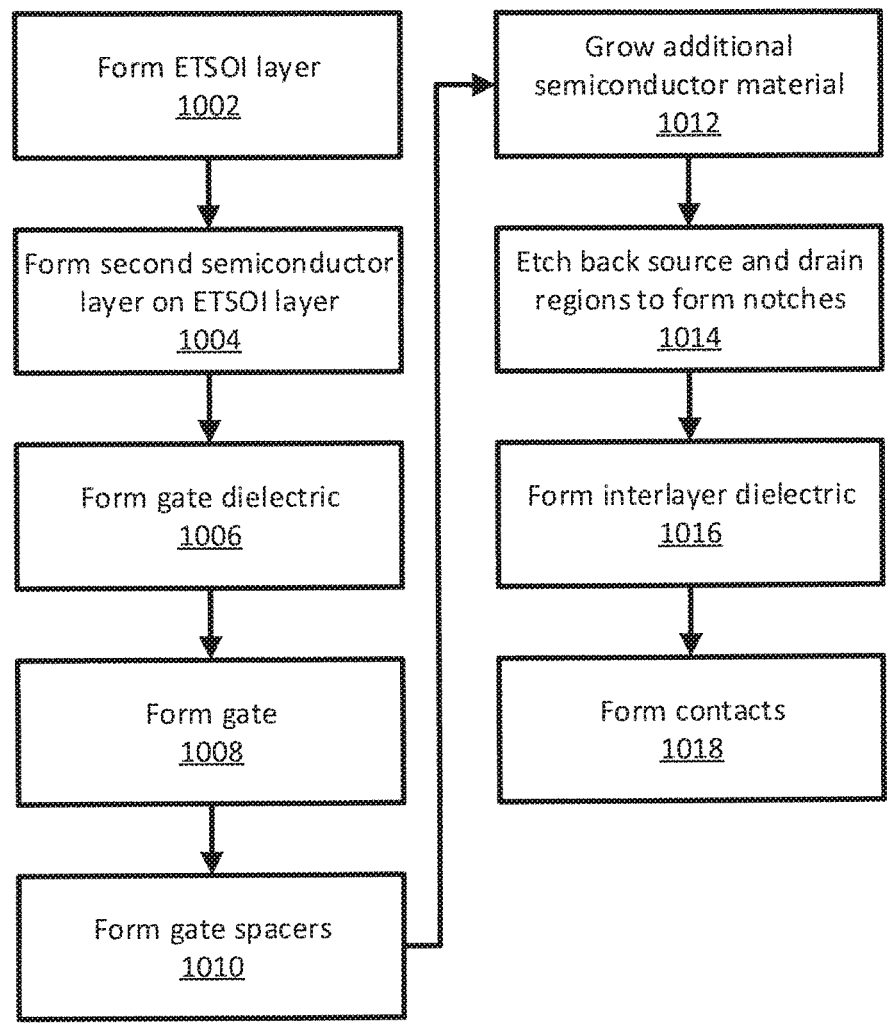
FIG. 10 is a block/flow diagram of a method of forming an SET in accordance with the present principles.

Referring now to FIG. 10, a method of forming an alternative embodiment of an SET is shown. Block 1002 forms an undoped ETSOI layer 804 by thinning a semiconductor layer through one or more thinning steps to achieve a thin semiconductor layer 804 that has, for example, a thickness of about 2 nm. The ETSOI layer 802 is undoped. Block 1004 then forms a second, doped semiconductor layer 804 on the ETSOI layer 802.

Block 1006 forms a gate dielectric and block 1008 forms a gate using, for example, a sidewall image transfer process that defines the length and width of the gate through the thickness of deposited sidewalls that are subsequently used as masks for anisotropic etches. Block 1010 forms gate spacers by conformally depositing a spacer material, such as silicon nitride, and then anisotropically etching away spacer material from the horizontal surfaces.

Block 1012 epitaxially grows additional semiconductor material on the doped semiconductor layer 806 around the gate spacers. It is specifically contemplated that the additional semiconductor material may also be doped, either in situ or by a subsequent doping process, and may be formed from the first semiconductor material, the second semiconductor material, or a different semiconductor material altogether. Block 1014 etches back the additional material and the second, doped semiconductor layer 806, using an etch that follows the crystal structure of the layers to create notches 906 between a channel region and a source/drain region. These notches 906 form the Coulomb barrier and are spaced such that a desired potential barrier is created. The etch stops on the ETSOI layer 804.

Block 1016 then forms an interlayer dielectric by depositing a dielectric material and then polishing down the top surface using, e.g., CMP. Contacts are formed to the source/drain extensions 904 and to the gate by forming vias in the interlayer dielectric and then depositing a contact conductor material. Exemplary materials for the contacts include, for example, tungsten, copper, aluminum, silver, gold, and alloys thereof. The contacts may be formed by any appropriate process including, e.g., CVD followed by a CMP that stops on the interlayer dielectric.

Having described preferred embodiments of a single-electron transistor with a self-aligned Coulomb blockade (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
    a thin channel region formed on a buried insulator;
    a source and drain region formed on the buried insulator, separated from the channel region by notches;
    an etch stop layer formed directly between the buried insulator and the channel, source, and drain regions; and
    a gate structure formed on the thin channel region.

2. The semiconductor device of claim 1, wherein the notches physically separate the channel region from the source and drain region.

3. The semiconductor device of claim 1, wherein the source and drain regions comprise a base layer and an epitaxially grown extension.

4. The semiconductor device of claim 1, further comprising a dielectric layer deposited in the notches to create a Coulomb blockade between the channel region and the source and drain regions.

5. The semiconductor device of claim 1, further comprising gate spacers formed on sidewalls of the gate and directly on the channel region.

6. The semiconductor device of claim 1, wherein the notches are formed along a consistent crystal face of the respective channel region and source and drain regions.

7. The semiconductor device of claim 1, wherein the etch stop layer comprises an undoped first semiconductor material and wherein the channel region comprises a doped second semiconductor material that is different from the first semiconductor material.

8. The semiconductor device of claim 7, wherein the etch stop layer has a thickness of about 2 nm and wherein the channel region has a thickness of about 4 nm.

9. A semiconductor device, comprising:
a thin channel region formed on a buried insulator;
a source and drain region formed on the buried insulator, physically separated from the channel region by notches that are formed along a consistent crystal face of the respective channel region and source and drain regions;
an etch stop layer formed directly between the buried insulator and the channel, source, and drain regions;
a dielectric layer formed in the notches to create a Coulomb blockade between the channel region and the source and drain regions; and
a gate structure formed on the thin channel region.

10. The semiconductor device of claim 9, wherein the source and drain regions comprise a base layer and an epitaxially grown extension.

11. The semiconductor device of claim 9, further comprising gate spacers formed on sidewalls of the gate and directly on the channel region.

12. The semiconductor device of claim 9, wherein the etch stop layer comprises an undoped first semiconductor material and wherein the channel region comprises a doped second semiconductor material that is different from the first semiconductor material.

13. The semiconductor device of claim 12, wherein the etch stop layer has a thickness of about 2 nm and wherein the channel region has a thickness of about 4 nm.

14. A semiconductor device, comprising:
a buried insulator layer;
an etch stop layer, formed directly on the buried insulator layer, comprising an undoped first semiconductor material;
a thin channel region, formed directly on the etch stop layer, comprising a doped second semiconductor material that is different from the first semiconductor material;
a source and drain region formed on the buried insulator, physically separated from the channel region by notches that are formed along a consistent crystal face of the respective channel region and source and drain regions;
a dielectric layer formed in the notches to create a Coulomb blockade between the channel region and the source and drain regions; and
a gate structure formed on the thin channel region.

15. The semiconductor device of claim 14, wherein the source and drain regions comprise a base layer and an epitaxially grown extension.

16. The semiconductor device of claim 14, further comprising gate spacers formed on sidewalls of the gate and directly on the channel region.

17. The semiconductor device of claim 14, wherein the etch stop layer has a thickness of about 2 nm and wherein the channel region has a thickness of about 4 nm.

* * * * *